United States Patent
Sievers

(10) Patent No.: US 8,933,390 B2
(45) Date of Patent: Jan. 13, 2015

(54) DATA TRANSMISSION THROUGH OPTICAL VIAS

(71) Applicant: Empire Technology Development LLC, Wilmington, DE (US)

(72) Inventor: Michael Sievers, Frederick, CO (US)

(73) Assignee: Empire Technology Development LLC, Wilmington, DE (US)

( * ) Notice: Subject to any disclaimer, the term of this patent is extended or adjusted under 35 U.S.C. 154(b) by 0 days.

(21) Appl. No.: 14/169,145

(22) Filed: Jan. 30, 2014

(65) Prior Publication Data

US 2014/0145189 A1    May 29, 2014

Related U.S. Application Data

(63) Continuation of application No. 13/002,043, filed on Dec. 29, 2010, now Pat. No. 8,680,458.

(51) Int. Cl.

| | |
|---|---|
| *H01L 31/173* | (2006.01) |
| *H01L 31/032* | (2006.01) |
| *G02B 6/43* | (2006.01) |
| *H01L 31/0224* | (2006.01) |
| *H01L 31/103* | (2006.01) |
| *H01L 31/105* | (2006.01) |
| *H01L 31/107* | (2006.01) |

(Continued)

(52) U.S. Cl.
CPC ............... *H01L 31/173* (2013.01); *G02B 6/43* (2013.01); *H01L 31/022408* (2013.01); *H01L 31/103* (2013.01); *H01L 31/105* (2013.01); *H01L 31/107* (2013.01); *H05K 1/0274* (2013.01); *H01L 33/58* (2013.01); *H01L 31/032* (2013.01); *H01L 31/18* (2013.01); *H01L 33/26* (2013.01); *H05K 3/46* (2013.01); *H05K 2201/10106* (2013.01); *H05K 2201/10121* (2013.01)
USPC .......................................... 250/227.11; 385/14

(58) Field of Classification Search
CPC ..................................... G02B 6/43; H05K 3/46
USPC ................ 250/227.11; 385/14, 88–94, 84, 49
See application file for complete search history.

(56) References Cited

U.S. PATENT DOCUMENTS

| | | |
|---|---|---|
| 5,564,642 A | 10/1996 | Auer et al. |
| 5,652,811 A | 7/1997 | Cook et al. |

(Continued)

FOREIGN PATENT DOCUMENTS

GB          2275576 A      8/1994

OTHER PUBLICATIONS

International Preliminary Report on Patentability issued on Apr. 9, 2013.

(Continued)

*Primary Examiner* — Thanh Luu
(74) *Attorney, Agent, or Firm* — Turk IP Law, LLC

(57) ABSTRACT

Technologies generally described herein relate to multilayer circuit boards with optical vias for data transmission between the layers. One or more regions may be created on a multilayer circuit board for optical vias. A transparent conducting oxide (TCO) layer can be deposited on a top and/or bottom layer of the circuit board. P-N junctions can be created over the TCO layer about the one or more regions to form optical vias as photo-emitting and/or photo-detecting components. The photo-emitting and/or photo-detecting components may be coupled to electronic components on the multilayer circuit board.

21 Claims, 9 Drawing Sheets

(51) Int. Cl.
*H05K 1/02* (2006.01)
*H01L 33/58* (2010.01)
*H01L 31/18* (2006.01)
*H01L 33/26* (2010.01)
*H05K 3/46* (2006.01)

(56) References Cited

U.S. PATENT DOCUMENTS

| | | | |
|---|---|---|---|
| 5,757,989 A * | 5/1998 | Yoshimura et al. | 385/14 |
| 7,095,920 B1 | 8/2006 | Little | |
| 7,263,248 B2 | 8/2007 | Windover | |
| 7,416,979 B2 | 8/2008 | Yoon et al. | |
| 7,471,856 B2 | 12/2008 | Degroot, Jr. et al. | |
| 7,474,825 B1 | 1/2009 | Horst et al. | |
| 7,486,847 B1 | 2/2009 | Dellmann et al. | |
| 7,538,358 B2 | 5/2009 | Badehi et al. | |
| 7,539,376 B2 | 5/2009 | Bozso et al. | |
| 7,583,879 B2 | 9/2009 | Chu et al. | |
| 7,616,889 B2 | 11/2009 | DeCusatis et al. | |
| 7,639,903 B2 | 12/2009 | Bicknell et al. | |
| 7,639,912 B2 | 12/2009 | Wang et al. | |
| 7,658,552 B2 | 2/2010 | Asghari | |
| 7,704,897 B2 | 4/2010 | Mungekar et al. | |
| 7,724,759 B2 | 5/2010 | Bozso et al. | |
| 2004/0156576 A1 | 8/2004 | Windover | |
| 2007/0007584 A1 | 1/2007 | Hwang et al. | |
| 2007/0258676 A1 | 11/2007 | Windover | |
| 2010/0024871 A1 | 2/2010 | Oh et al. | |
| 2010/0025362 A1 | 2/2010 | Shea et al. | |

OTHER PUBLICATIONS

Zhou, "Indium Tin Oxide (ITO) Deposition, Patterning and Schottky Contact Fabrication", A thesis submitted in partial fulfillment of the requirements for the degree of Master of Science in Microelectric Engineering, Department of Microelectric Engineering, College of Engineering, Rochester, New York, Dec. 2005, 89 pages.

Favi et al., "Techniques for Fully Integrated Intra/Inter-Chip Optial Communiation" Poceedings of the 45th annual Design Automation Conference, Anaheim, California, pp. 343-344.

Wang et al., "Session DD: P-Type Doping and Electroluminescence in ZnO", Band Edge Electroluminescence from N+ Implanted Bulk ZnO, Department of Chemical Engineering, University of Florida, Gainesville, FL 3261, Pennsylvania State Univerisity, University Park, PA, Jun. 30, 2006.

International Search Report and Written Opinion for PCT/US2010/051778 dated Dec. 16, 2010.

TimeDomain CDV, Inc. "Plasma-Enhanced Deposition from TEOS and Oxygen", accessed from http://www.timedomaincvd.com/CVD_Fundamentals/films/PECVD_TEOS.html; Retrieved on Nov. 4, 2012.

Morioka et al., "An Approach to Slurry Characterization for CMP", vol. 11, pp. 153-155, 2004, http://www.nittahaas.com/technology/pdf/200421.pdf.

* cited by examiner

DATA TRANSMISSION THROUGH OPTICAL VIAS

CROSS-REFERENCE TO RELATED APPLICATIONS

This application is a continuation of co-pending U.S. patent application Ser. No. 13/002,043 filed on Dec. 29, 2010, which is the national phase filing of the PCT Application No. PCT/US10/051788 filed on Oct. 7, 2010 by the same inventor, commonly assigned herewith. Therefore, both applications are herein incorporated by reference in their entireties.

BACKGROUND

Unless otherwise indicated herein, the materials described in this section are not prior art to the claims in this application and are not admitted to be prior art by inclusion in this section.

As electronic circuit design advances increasingly complex integrated systems are developed with high density and throughput. Thus, inter-chip communication on circuit boards involves higher and higher data rates. Increased data rates are, however, associated with high currents, which in turn are major challenges for noise mitigation and power dissipation in circuit design. Parallel communications is one mitigation approach, but at a cost of large circuit board area. Other approaches for higher data rates include using flip-chip or chip-level via technologies, which are associated with reliability, cost, and flexibility concerns. Increasing on-board communication bandwidth is especially challenging in multiprocessor systems.

The present disclosure appreciates that there are several limitations with conventional circuit board designs, especially for high data rate communications. Alternative approaches to overcome the limitations of conventional circuit board designs further include wireless solutions based on capacitive or inductive methods. Capacitive and inductive methods may be effective in reducing power and providing high speed, but they typically work for pairs of chips. Therefore, these approaches are ineffective for multi-chip systems.

SUMMARY

The following summary is illustrative only and is not intended to be in any way limiting. In addition to the illustrative aspects, embodiments, and features described above, further aspects, embodiments, and features will become apparent by reference to the drawings and the following detailed description.

The present disclosure generally describes technologies related to multilayer circuit boards with optical vias for data transmission between the layers.

Some example multilayer circuit boards described herein may include a circuit board with two or more conductive layers separated by a dielectric layer. An optical via can be configured to provide an optical transmission path between the two or more layers of the circuit board. Other example multilayer circuit boards may include a photo-emitter component coupled to one end of the optical via and configured to convert incident electrical signals to optical signals. The multilayer circuit boards may also include a photo-detector component coupled to another end of the optical via and configured to convert the optical signals to received electrical signals.

The present disclosure also generally describes methods for manufacturing a multilayer circuit board with optical vias for data transmission between the layers. Some example methods may include creating one or more regions of the multilayer circuit board for optical vias and depositing a transparent conducting oxide (TCO) layer on a top layer of the multilayer circuit board. Other example methods may include creating p-n junctions about the regions for the optical vias and creating electrical connections to the p-n junctions acting as light emitting diodes (LEDs).

The present disclosure further describes an apparatus adapted to control the manufacturing of a multilayer circuit board including optical vias for data transmission between the layers. An example apparatus according to some embodiments may include a memory with instructions stored thereon and a processor coupled to the memory and configured to execute the instructions. When the instructions are executed, the apparatus can create one or more regions for optical vias in the multilayer circuit board for data transmission between electrical components located on top and bottom layers of the multilayer circuit board. According to some other examples, the apparatus may deposit a transparent conducting oxide (TCO) layer on the top and bottom layers of the multilayer circuit board and create p-n junctions about the regions for the optical via locations at the top and bottom layers by implanting the TOO layer with n-type impurities. According to further examples, the apparatus may create electrical couplings to the p-n junctions, where the p-n junctions are effective to act as either light emitting diodes (LEDs) or photodiodes.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

DETAILED DESCRIPTION

Figure 1:
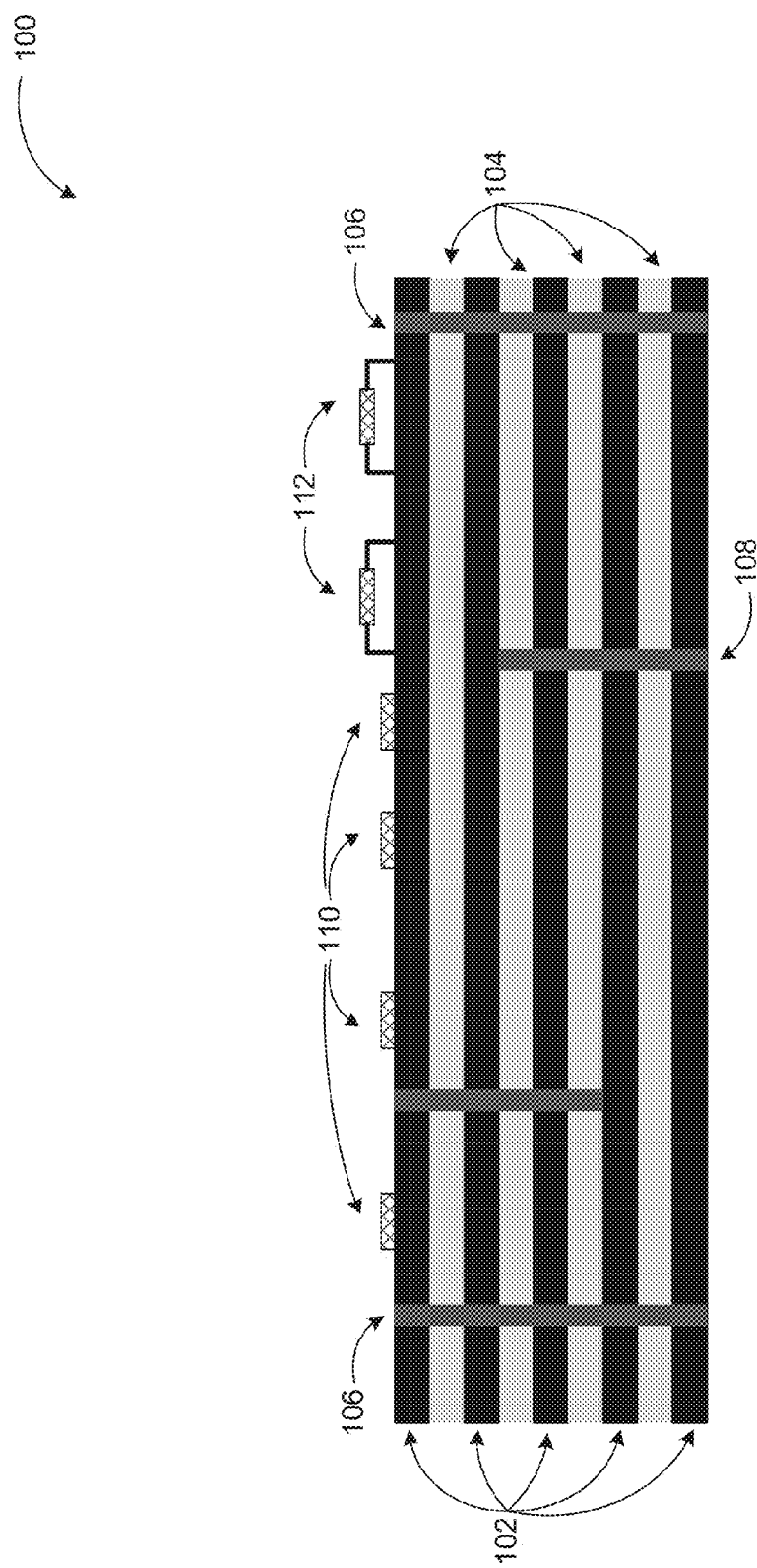
FIG. 1 illustrates an example multilayer circuit board with electrical vias connecting one or more layers of the board.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to methods, apparatus, systems, devices, and/or computer program products related to multilayer circuit boards with optical vias for data transmission, methods of manufacturing such circuit boards, and apparatuses for manufacturing such circuit boards.

Briefly stated, technologies generally described herein relate to multilayer circuit boards with optical vias for data transmission between the layers. One or more regions may be created on a multilayer circuit board for optical vias. A transparent conducting oxide (TCO) layer can be deposited on a top and/or bottom layer of the circuit board. P-N junctions can be created over the TOO layer about the one or more regions to form optical vias as photo-emitting and/or photo-detecting components. The photo-emitting and/or photo-detecting components may be coupled to electronic components on the multilayer circuit boardphoto-emitterphoto-detector.

FIG. 1 illustrates an example multilayer circuit board with optical vias coupling optical signals between one or more layers of the board, arranged in accordance with at least some examples described herein. A multilayer circuit board shown in diagram 100 is an example of a printed circuit board (PCB). PCBs can be used to mechanically support and electrically connect electronic components using conductive pathways or signal traces formed on non-conductive substrates. A printed circuit board with electronic components (e.g. components 110, 112) can also be referred to as a printed circuit assembly (PCA) or a printed circuit board assembly (PCBA).

The multilayer circuit board may comprise two or more conducting layers 102, each conductive layer typically being made of a thin metal foil such as copper or similar metals. The conducting layers 102 can be separated by insulating layers 104 made from a dielectric material. The dielectric material may include, but is not limited to, polytetrafluoroethylene (Teflon), phenolic cotton paper (FR-2), cotton paper and epoxy (FR-3), woven glass and epoxy (FR-4), etc.

Electronic components (110) may be coupled to traces on top or bottom layers of the multilayer circuit board or coupled to the traces (112), which may be implemented as any signal path like metal deposited signal traces, wires (112) or leadframes, etc. In some examples the electronic components (110) can be coupled via an adhesive such as an epoxy. In other examples, the electronic components (110) can be coupled via a metal alloy material such as solder. In still other examples, the electronic components (110) can be coupled by a eutectic attachment process that may use one or more metal or metal alloy materials. Eutectic attachment processes heat the substrate and the die to a point, where the metal (e.g., gold) back of the die is adhered to the surface of the substrate by applying ultrasonic energy. Other methods of affixing the electronic components may include employing epoxy (conductive or non-conductive epoxy) or similar approaches.

The traces (112), which can be formed through chemical etching, laser shaping, or comparable methods like sputtering, plating, printing (e.g., hybrids) provide electrical couplings between the components. In a multilayer circuit board, the electrical couplings between the components can be represented as a three-dimensional layout. In addition to the two-dimensional layout of the traces on the top and bottom layers providing coupling points (e.g. pads) to the electronic components and couplings between the components, additional trace layouts may be designed into one or more inner conductive layers.

The traces on the conductive layers may be categorized as signal traces, power traces, or ground traces. Power and ground traces can be utilized to provide supply voltage/current to the various electronic components (110). In some designs, a substantial portion of or an entire inner conductive layer may be used as a power or ground plane. Interconnectivity between the conductive layers can be provided through vias that are formed through one or more layers. A via is typically a hole that is formed, e.g. drilled or etched, through the layers of the circuit board, which may subsequently be filled with conductive material (e.g. metal, solder, etc.) to couple those layers together (i.e. to form a conductive circuit path between the layers). Some vias may be through the entire multilayer circuit board (106), while other vias may be limited to a portion of the layers (108). Examples drilled holes may include mechanical or laser drilled holes, while examples of etched hole formation may involve the use of various chemicals like ferric chloride, ammonium persulfate, hydrochloric acid, or similar chemicals.

Figure 2:
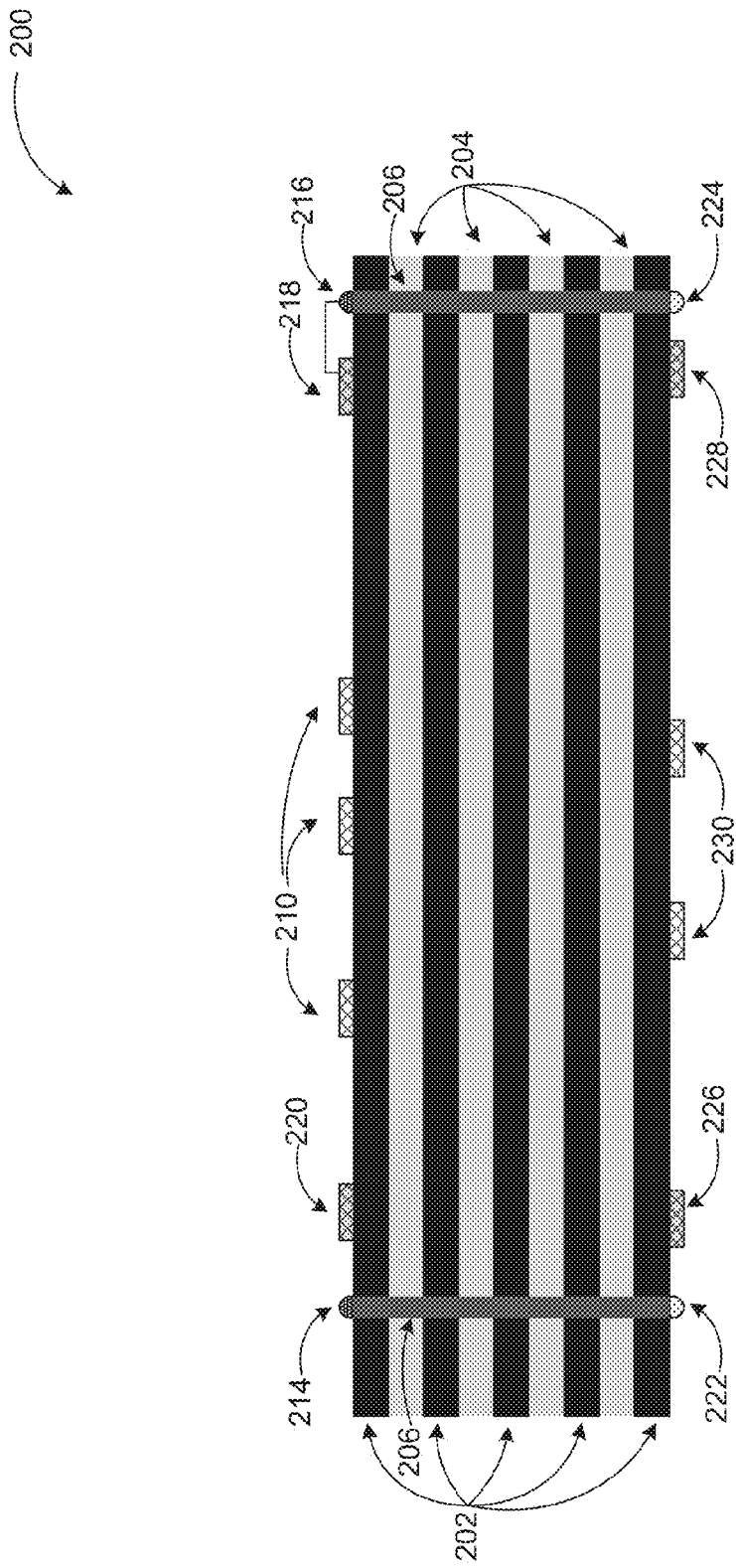
FIG. 2 illustrates example multilayer circuit board according to at least some embodiments with optical vias providing optical connection between top and bottom layers of the board.

FIG. 2 illustrates an example multilayer circuit board according to at least some embodiments with optical vias providing optical connection between top and bottom layers of the board, arranged in accordance with at least some embodiments described herein.

Double-sided circuit boards with electronic components on either side of the board are commonly used. As mentioned previously, increasingly higher density components such as microprocessors are used in electronic devices raising the need for bandwidth in data communication between those components. A multilayer circuit board 200 with high performance components (e.g. components 210 or 230) may be adapted to utilize optical vias 206 for communication between components on either side of the circuit board.

Optical vias 206 may be formed in the board by chemical etching, mechanical drilling, laser drilling, or similar methods and filled with a material suitable for transmission of light (e.g. glass). In the example multilayer circuit board 200 comprising conductive layers 202 and dielectric layers 204, the optical vias 206 connect the top and bottom conductive layers.

Photo-emitting/photo-detecting component pairs (214/222, 216/224) may be formed at opposite ends of the optical vias 206 for transmission and reception of optical signals. The photo emitting/detecting components convert electrical signals provided through traces on either top or bottom layer, or through wire-connection (e.g. component 216) to optical signals and vice versa. Components 220, 218, 226, and 228 represent electronic parts that may be used to control the signals to and from the photo emitting/detecting components (e.g. adjusting amplitude, frequency, etc. of the signals, digital-analog or analog-digital conversion, and comparable operations).

Figure 3:
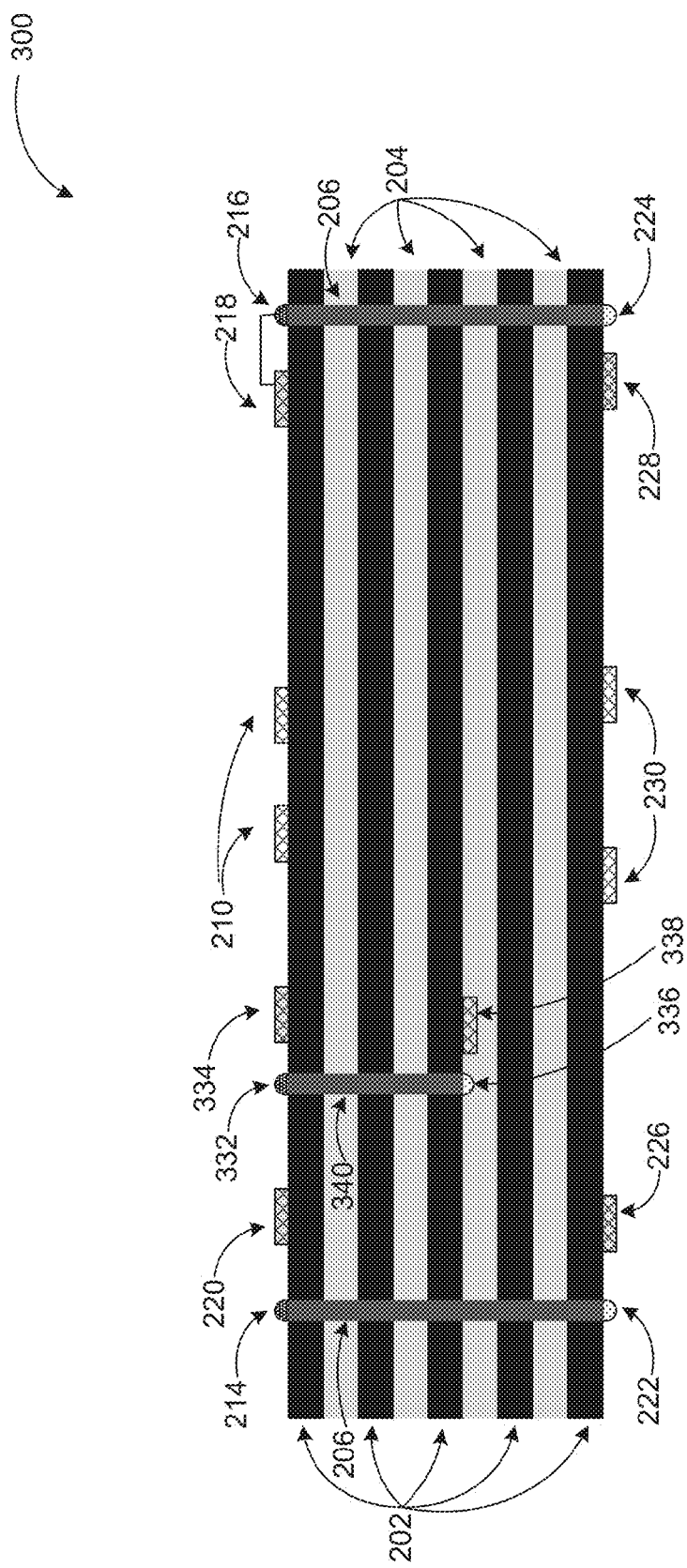
FIG. 3 illustrates another example multilayer circuit board according to at least some embodiments with optical vias providing optical connection between different layers of the board.

FIG. 3 illustrates another example multilayer circuit board that is arranged according to at least some embodiments described herein, where optical vias are configured to provide optical connections between different layers of the board. Multilayer circuit board 300 of FIG. 3 is similar to the multilayer circuit board 200 of FIG. 2, where similarly numbered elements are formed in a likewise manner and/or perform similar tasks (e.g. optical vias 206).

Differently from FIG. 2, multilayer circuit board 300 includes optical via 340 with photo emitting/detecting components 332, 336 at each end of the optical via. While component 332 and associated electronic control component 334 are on the top layer, photo emitting or detecting component 336 is formed in an inner non-conductive layer of the multilayer circuit board 300 along with the associated control component 338.

While the circuit board is being manufactured, a transparent conductive oxide (TCO) layer may be deposited on the inner layer, p-n junction created through implantation with impurities, and the photo emitting or detecting component 336 formed where the optical via 340 ends. Similarly, control component 338 may be formed in the inner dielectric layer. Resistance or capacitance controlled dielectric layers are well known and used in the art. Control component 338 may be a resistive or semi-conductor component. Thus, optical via 340 may provide optical data communication between the top layer and connections for other components on the inner layer.

Figure 4:
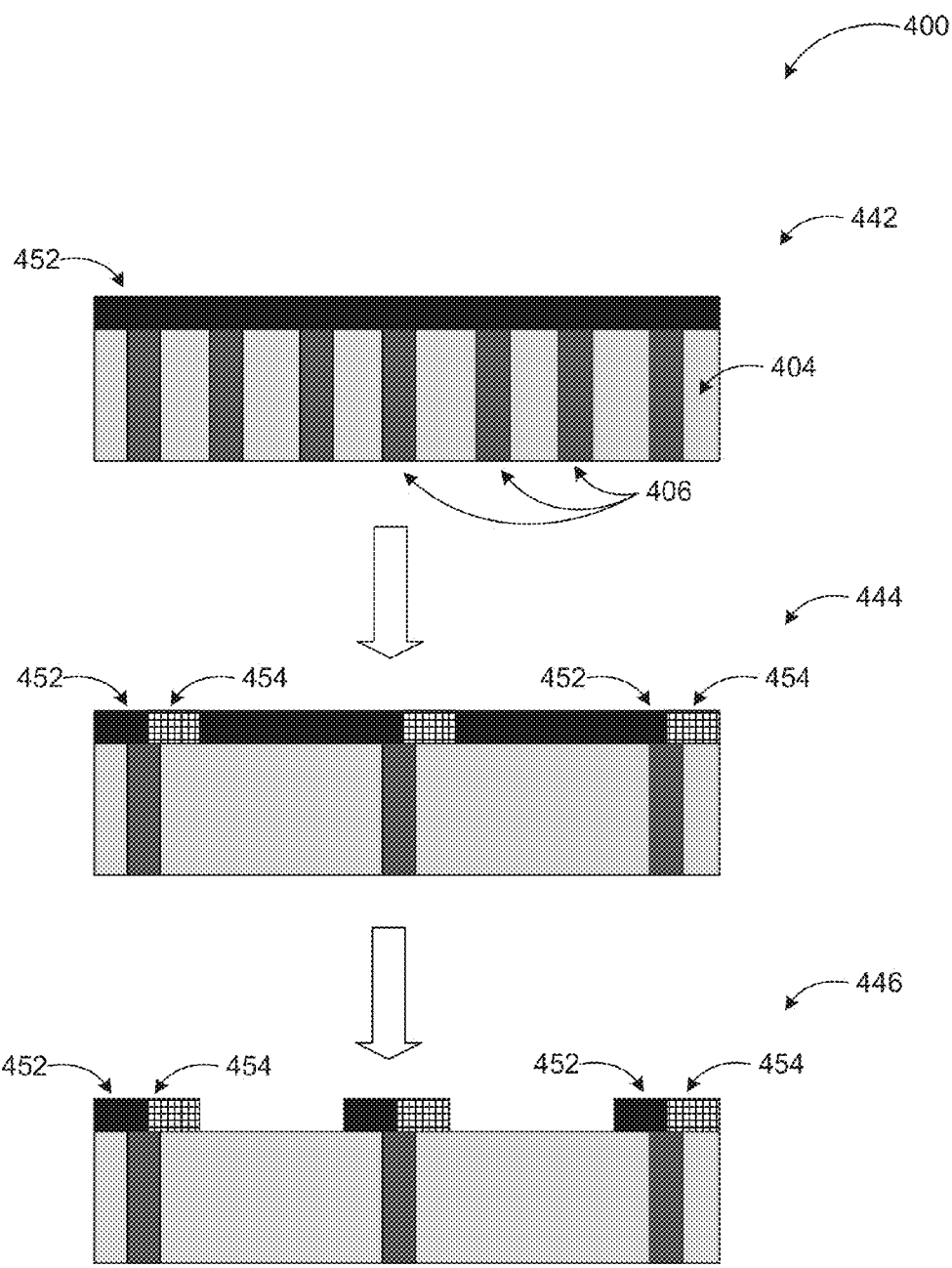
FIG. 4 illustrates three different phases in manufacturing a multilayer circuit board with optical vias.
Figure 5:
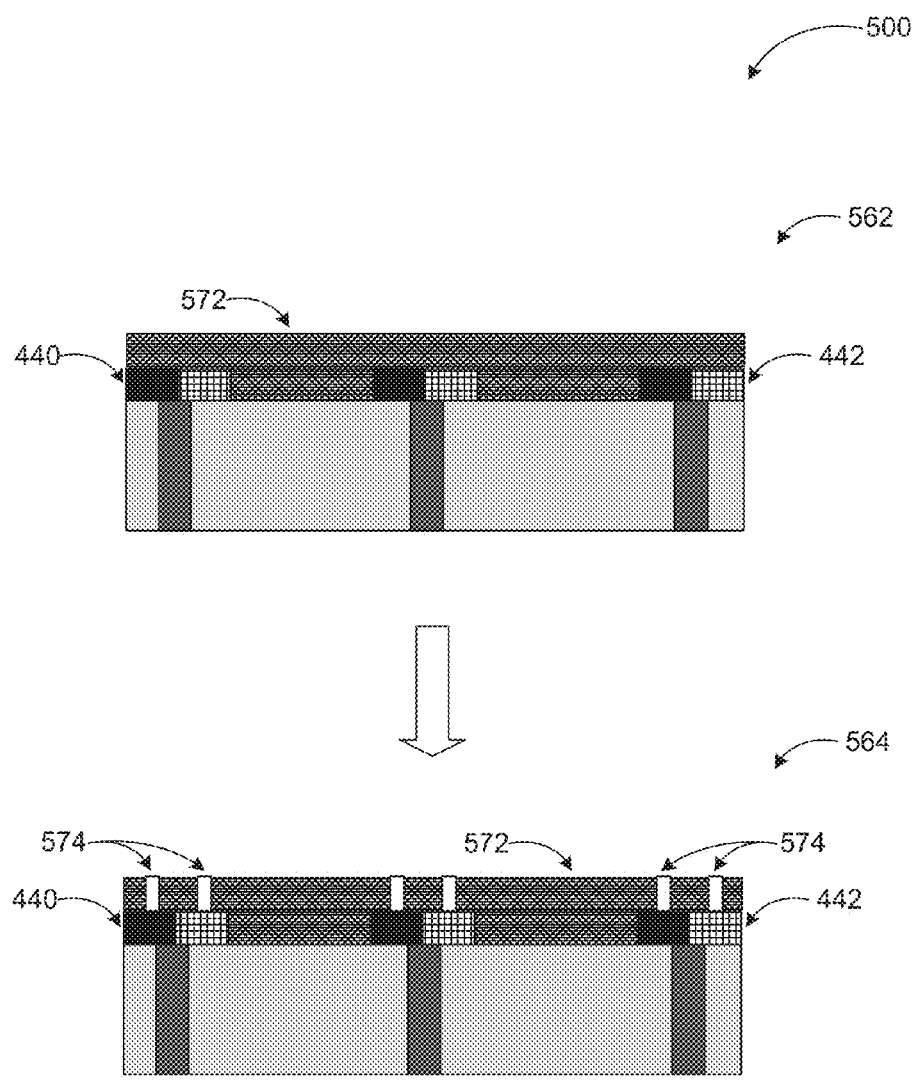
FIG. 5 illustrates two more phases in manufacturing of a multilayer circuit board with optical vias.

FIG. 4 illustrates three different phases in manufacturing a multilayer circuit board with optical vias, arranged in accordance with at least some embodiments described herein. A circuit board according to embodiments may be manufactured in a variety of ways through sequential or parallel production steps. Diagram 400 of FIG. 4 and diagram 500 of FIG. 5 illustrate one example sequence of production steps. Of course, embodiments may be implemented employing other sequences, additional or fewer steps, and/or additional or fewer materials.

Multilayer circuit board 442 may be at a stage of PCB manufacturing, where optical vias 406 can be formed in the circuit board through chemical, mechanical, or thermal methods. A conformal layer of a transparent conducting oxide (452) may be deposited on the top layer using lithography or similar techniques. The TCO layer may be formed using $SnO_2$, ZnO, ITO, or similar materials. Multilayer circuit board 444 represents a subsequent phase of manufacturing, where the TCO layer 452 can be implanted with impurities creating p-n junctions 454 over the optical vias. Alternatively, the p-n junctions may be created inside the vias (at each end).

At a subsequent phase of manufacturing multilayer circuit board 446, the p-n junctions may be isolated to form diodes (photo emitting or detecting). While one side of the multilayer circuit board is shown in the diagrams, the process may be performed for both sides (top and bottom) simultaneously or sequentially such that corresponding photo-emitter/detector diode pairs are formed on both ends of each optical via.

FIG. 5 illustrates two more phases in manufacturing of a multilayer circuit board with optical vias, in accordance with at least some embodiments of the present disclosure. Multilayer circuit board 562 of diagram 500 illustrates a subsequent phase of manufacturing, where planar dielectric layer is deposited over the top layer and the p-n junctions. The planarization may be accomplished by chemical or mechanical methods.

To provide electrical connection between the photo-emitter/detector components and other electronic components (e.g. processors) of the circuit board, electrical vias 574 may be drilled or etched in the dielectric layer 572 such that a connection is provided to each side (440, 442) of the p-n junctions. The vias may be subsequently filled with a conductive material (e.g. a metal such as tungsten) for the electrical connection.

Figure 6:
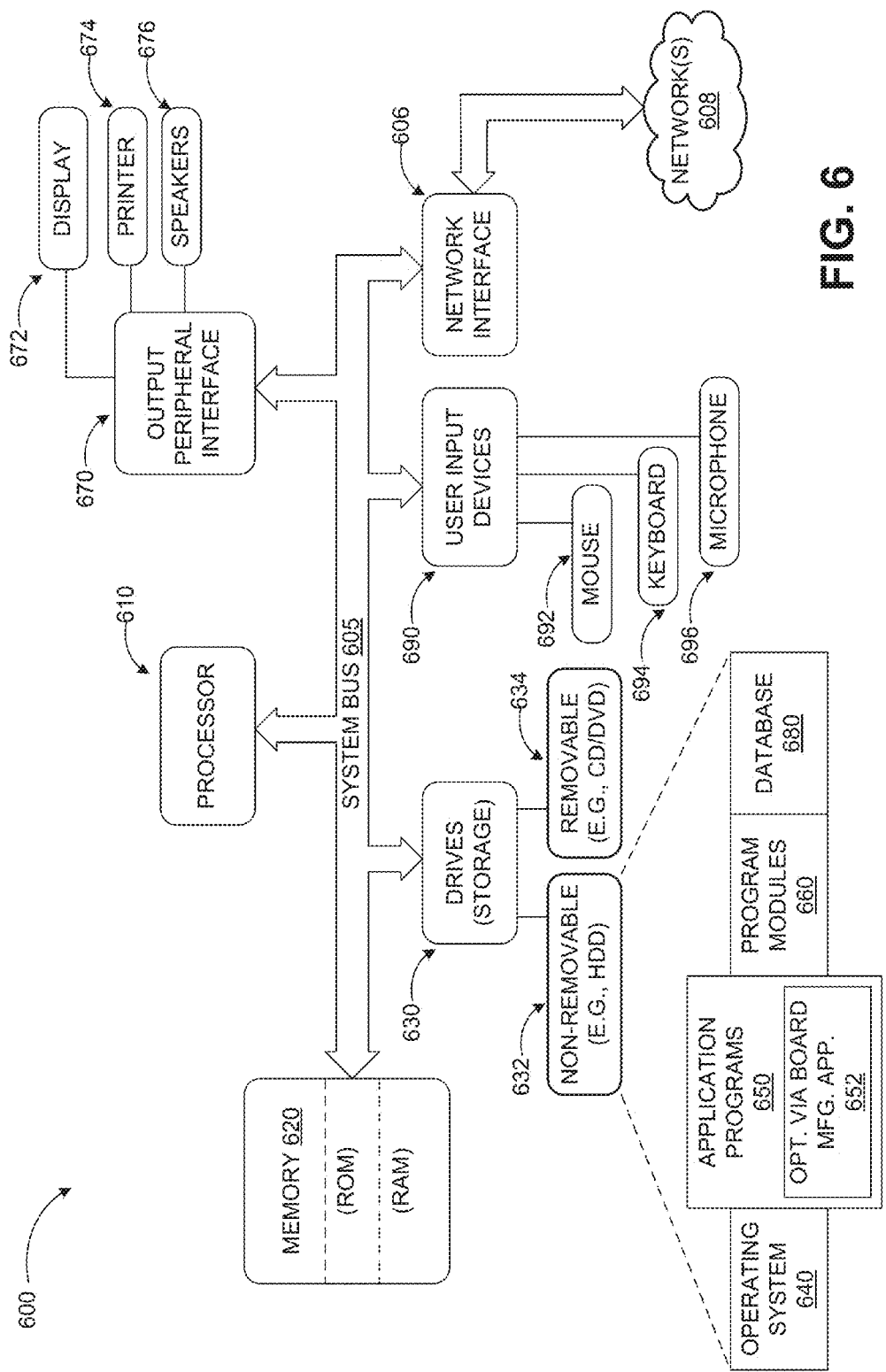
FIG. 6 illustrates a general purpose computing device, which may be used to control manufacturing of a multilayer circuit board with optical vias for data transmission.

FIG. 6 illustrates a general purpose computing device, which may be used to control manufacturing of a multilayer circuit board with optical vias for data transmission arranged in accordance with at least some embodiments of the present disclosure.

Computer 600 includes a processor 610, memory 620, and one or more drives 630. The drives 630 and their associated computer storage media such as removable storage media 634 (e.g., CD-ROM, DVD-ROM) and non-removable storage media 632 (e.g. a hard drive disk), may provide storage of computer readable instructions, data structures, program modules and other data for the computer 600. Drives 630 may include an operating system 640, application programs 650, program modules 660, and database 680. Computer 600 further may include user input devices 690 through which a user may enter commands and data. Input devices 690 may include an electronic digitizer, a microphone 696, a keyboard 694, and a pointing device such as a mouse device 692, trackball device or touch pad device. Other input devices may include a joystick device, game pad device, satellite dish, scanner device, or the like.

Application programs 650 may include an optical via circuit board manufacturing application 652, which may control automated circuit board production systems. Optical via circuit board manufacturing application 652 may provide instructions to different circuit board production modules for various phases of production such as etching, drilling, lamination, metallization, and comparable steps. User feedback through one of the input devices or in form of computer-readable instructions may be used to determine layout, materials, and other parameters of the circuit board design.

The above described and other input devices may be coupled to processor 610 through a user input interface that is coupled to a system bus 605, but may be coupled by other interface and bus structures, such as a parallel port, game port or a universal serial bus (USB). Computers such as computer 600 may also include other peripheral output devices such as speakers 676, printer 674, and display 672, which may be coupled through an output peripheral interface 670 or the like.

Memory 620, removable storage devices 634 and non-removable storage devices 632 are examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computer 600. Any such computer storage media may be part of computer 600.

Computer 600 may operate in a networked environment using logical connections to one or more computers, such as a remote computer connected to network interface 606. The remote computer may be a personal computer, a server, a router, a network PC, a peer device or other common network node, and can include many or all of the elements described above relative to computer 600. Networking environments are commonplace in offices, enterprise-wide area networks (WAN), local area networks (LAN), intranets and world-wide networks such as the Internet. For example, in the subject matter of the present application, computer 600 may comprise the controller machine from which data is being migrated to multilayer circuit board manufacturing systems such as automatic drill systems, etching systems, etc., and the remote computer may comprise controllers of the systems. It should be noted, however, that source and destination machines need not be coupled together by a network(s) 608 or any other means, but instead, data may be migrated via any media capable of being written by the source platform and read by the destination platform or platforms. When used in a LAN or WLAN networking environment, computer 600 may be coupled to the LAN through network interface 606 or an adapter.

The network(s) may comprise any topology employing servers, clients, switches, routers, modems, Internet service providers (ISPs), and any appropriate communication media (e.g., wired or wireless communications). A system according to some embodiments may have a static or dynamic network topology. The network(s) may include a secure network such as an enterprise network (e.g., a LAN, WAN, or WLAN), an unsecure network such as a wireless open network (e.g., IEEE 802.11 wireless networks), or a world-wide network such as (e.g., the Internet). The network(s) may also comprise a plurality of distinct networks that are adapted to operate together. The network(s) are adapted to provide communication between the nodes described herein. By way of example, and not limitation, the network(s) may include wireless media such as acoustic, RF, infrared and other wireless media.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computer 600 may be implemented as a portion of a small-form factor portable (or mobile) electronic device such as a portable computing device, a mobile computing device, an application specific device, or a hybrid device that include any of the above functions. Computer 600 may also be implemented as a personal computer including both laptop computer and non-laptop computer configurations. Moreover, computer 600 may be implemented as a networked system or as part of a general purpose or specialized server.

Figure 7:
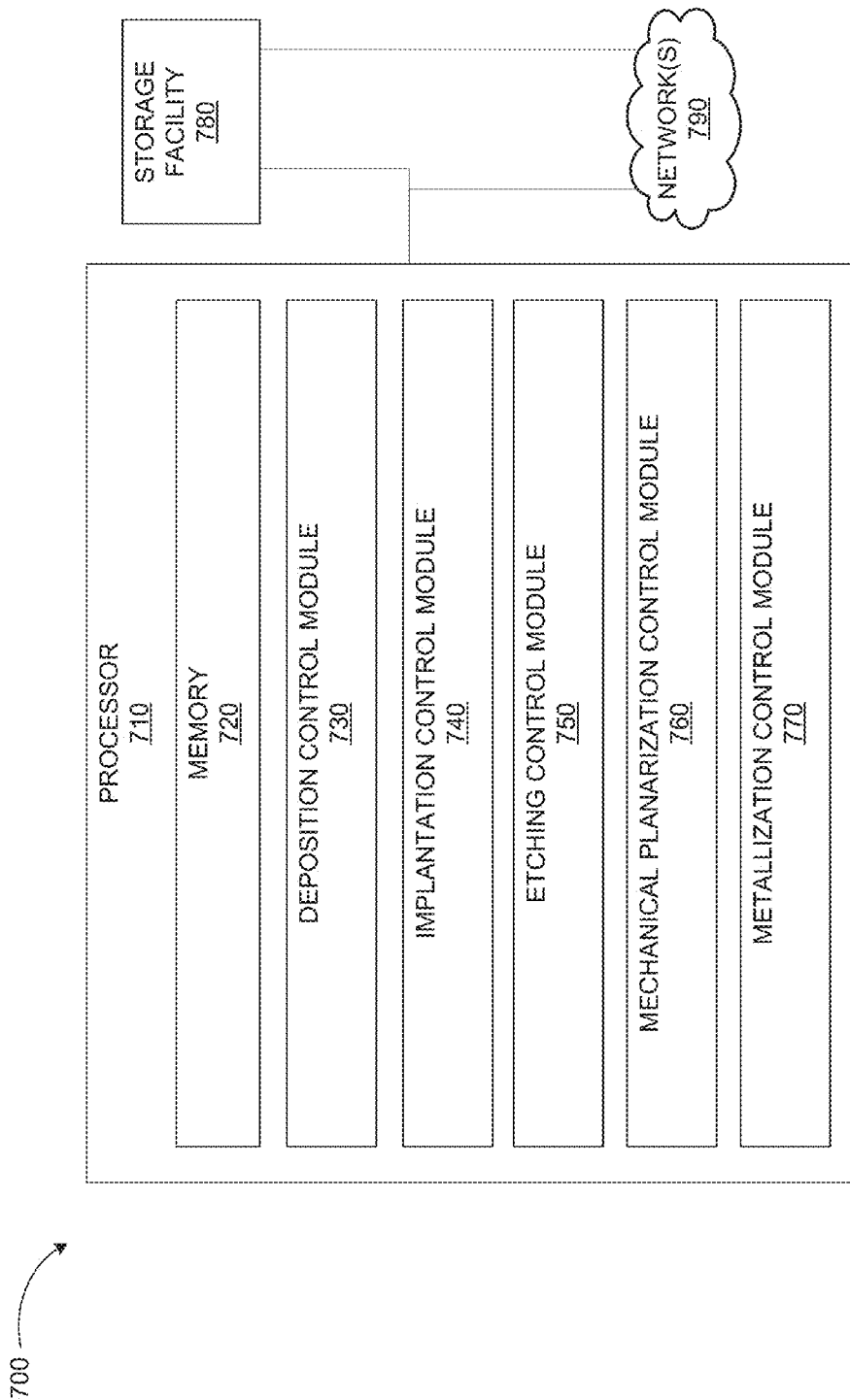
FIG. 7 illustrates a special purpose processor, which may be used to control manufacturing of a multilayer circuit board with optical vias for data transmission.

FIG. 7 illustrates a special purpose processor, which may be used to control manufacturing of a multilayer circuit board with optical vias for data transmission, arranged in accordance with at least some embodiments of the present disclosure. Processor 710 of diagram 700 may be part of an automated circuit board manufacturing system communicatively coupled to one or more modules responsible for different phases of multilayer circuit board manufacturing process.

Processor 710 may include a number of control modules configured to control different aspects of manufacturing a multilayer circuit board with optical vias according to some embodiments. For example, deposition control module 730 may be configured to manage deposition of a transparent conducting oxide (TCO) layer on the top and bottom layers of the multilayer circuit board, in which p-n junctions may be formed as photo-emitter or photo-detector components over the vias for optical communication. Deposition control module 730 may be further configured to manage deposition of a dielectric layer over the patterned TCO layer such that electrical connections to the p-n junctions may be created through vias in the dielectric layer for connecting the p-n junctions to the electronic components on the circuit board.

Implantation control module 740 may be configured to control implantation of the TCO layer with n-type or p-type impurities to create the p-n junctions. Etching control module 750 may be configured to manage chemical removal of optical via regions and/or conductive material on top and/or bottom conductive layers for forming the traces. Mechanical planarization control module 760 may be configured to control planarization of the TCO layer and/or the dielectric layer prior to filling of the optical vias with optically conducting material (e.g. glass) and the electrical vias with conductive material (e.g. metal). Metallization control module 770 may be configured to manage filling of the electrical vias with metallic material (pure metal or alloy).

Memory 720 may be configured to store instructions for the control modules of processor 710, which may be implemented as hardware, software, or combination of hardware and software. Processor 710 may be configured to communicate through electrical couplings or through networked communications (e.g., network(s) 790) with other computing devices and/or data stores such as storage facility 780.

Example embodiments may also include methods. These methods can be implemented in any number of ways, including the structures described herein. One such way is by machine operations, of devices of the type described in the present disclosure. Another optional way is for one or more of the individual operations of the methods to be performed in conjunction with one or more human operators performing some of the operations while other operations are performed by machines. These human operators need not be collocated with each other, but each can be only with a machine that performs a portion of the program. In other examples, the human interaction can be automated such as by pre-selected criteria that are machine automated.

Figure 8:
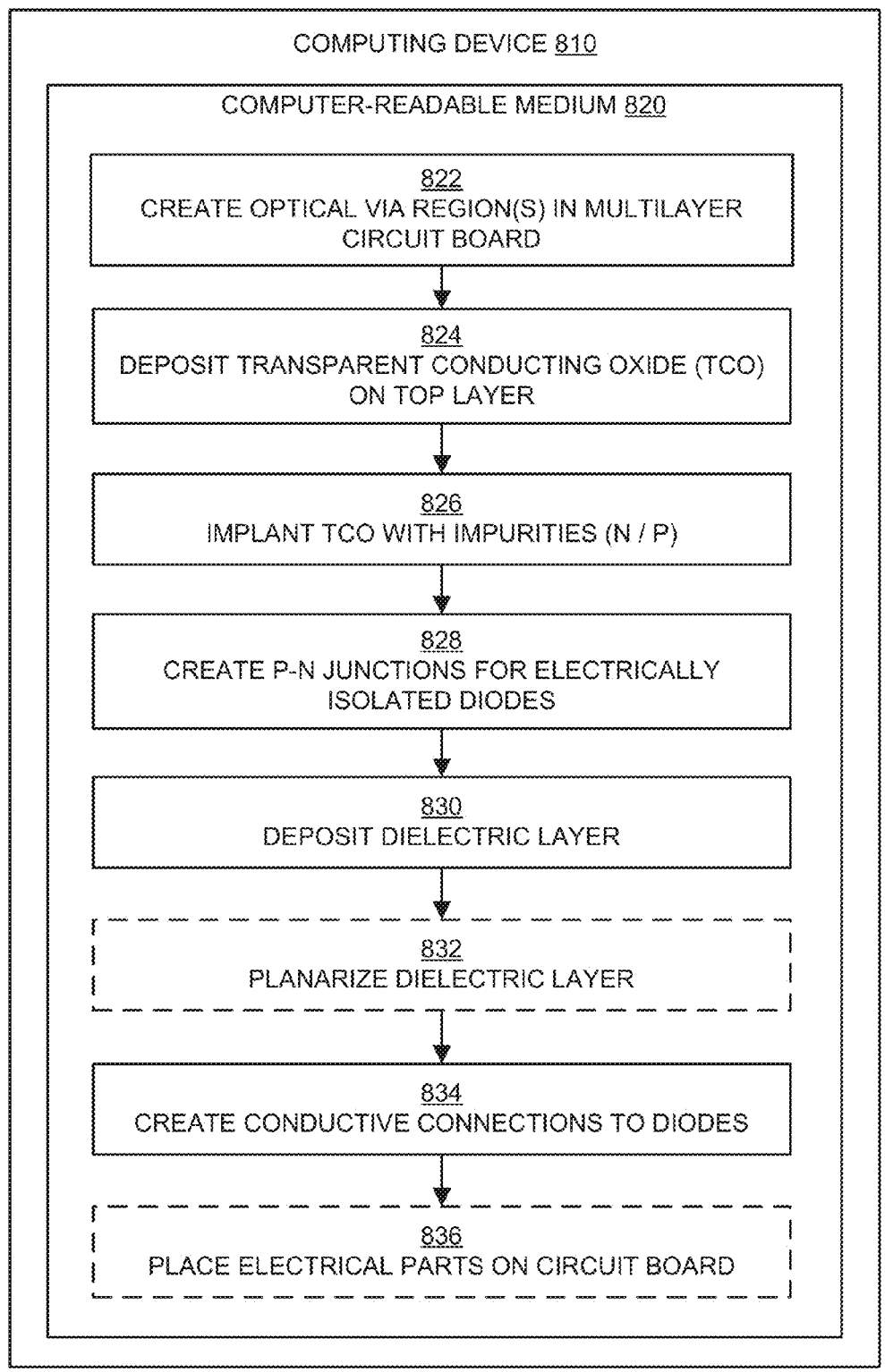
FIG. 8 is a flow diagram illustrating an example method that may be performed by a computing device, such as computer 600 in FIG. 6 or special purpose processor 710 in FIG. 7.

FIG. 8 is a flow diagram illustrating an example method that may be performed by a computing device, such as computer 600 in FIG. 6 or special purpose processor 710 in FIG. 7. The operations described in blocks 822 through 836 may be stored as computer-executable instructions in a computer-readable medium such as drives 640 of computer 600 or memory 720 of processor 710.

A process of manufacturing a multilayer circuit board with optical vias for data transmission may begin with operation 822, "CREATE REGIONS FOR OPTICAL VIA(S) IN MULTILAYER CIRCUIT BOARD." At operation 822, holes may be drilled through mechanical, chemical, or other methods (e.g. laser drilling) on a multilayer circuit board for optical vias such as vias 206 in FIG. 2. Operation 822 may be followed by operation 824.

At operation 824, "DEPOSIT TRANSPARENT CONDUCTING OXIDE (TCO) ON TOP LAYER" following operation 822, a layer of TOO (layer 452 of FIG. 4) may be deposited on the top layer of the circuit board. According to other embodiments, the same operation may be repeated for the bottom layer of the multilayer circuit board. Operation 824 may be followed by operation 826.

At operation 826, "IMPLANT TCO WITH IMPURITIES" following operation 824, n- or p-type impurities are impregnated into the TOO layer. With the implantation of impurities, p-n junctions are formed on the top (or bottom) layer of the multilayer circuit board about the optical vias 206. The p-n junctions may be formed over the vias 206 or within the vias by injecting the material into the vias. Operation 826 may be followed by operation 828.

At operation 828, "CREATE P-N JUNCTIONS FOR ELECTRICALLY ISOLATED DIODES" following operation 826, the p-n junctions are isolated into photo emitting or photo detecting diodes (or diode pairs) such as diodes 214, 216, 222, 224 of FIG. 2. Once coupled to electronic components (e.g. 210) on the multilayer circuit board, the photo emitting/detecting diode pairs may be used to transfer data between the electronic components with high bandwidth. Operation 828 may be followed by operation 830.

At operation 830, "DEPOSIT DIELECTRIC LAYER" following operation 828, a layer of dielectric (layer 572 of FIG. 5) may be deposited on the top layer of the circuit board and the p-n junctions. Operation 830 may be followed by operation 832.

At operation 832, "PLANARIZE DIELECTRIC LAYER", the dielectric layer may be planarized. Operation 832 may be followed by operation 834.

At operation 834, "CREATE CONDUCTIVE CONNECTIONS TO DIODES", electrical connections can be created for the p-n junctions (or photo emitting/detecting diodes). The electrical connections may be created by drilling (or etching) vias 574 in the dielectric layer and metallizing those vias. Operation 834 may be followed by operation 836.

At optional operation 836, "PLACE ELECTRICAL PARTS ON CIRCUIT BOARD", the multilayer circuit board may be populated with electronic components and connections established (e.g. soldering stage). When the circuit board is operational, data communication between the components may be at least partially accomplished through optical communication increasing bandwidth capacity while reducing supply current and noise compared to conventional components.

The operations included in the above described process are for illustration purposes. Manufacturing a multilayer circuit board with optical vias may be implemented by similar processes with fewer or additional operations. In some examples, the operations may be performed in a different order. In some other examples, various operations may be eliminated. In still other examples, various operations may be divided into additional operations, or combined together into fewer operations.

Figure 9:
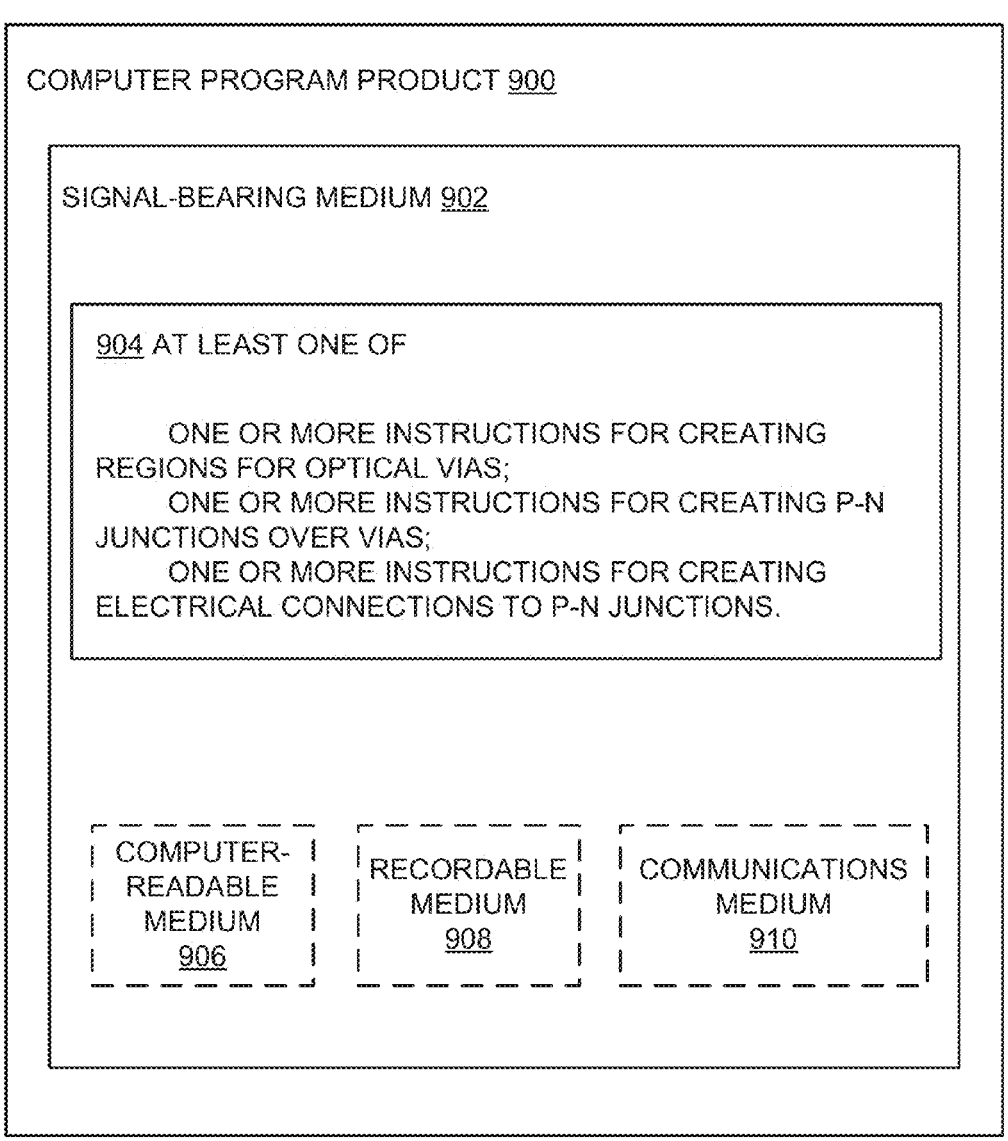
FIG. 9 illustrates a block diagram of an example computer program product, all arranged in accordance with at least some embodiments described herein.

FIG. 9 illustrates a block diagram of an example computer program product, all arranged in accordance with at least some embodiments described herein. In some examples, as shown in FIG. 9, computer program product 900 may include a signal bearing medium 902 that may also include machine readable instructions 904 that, when executed by, for example, a processor, may provide the functionality described above with respect to FIG. 6 and FIG. 7. Thus, for example, referring to processor 710, the control modules 730 through 770 may undertake one or more of the tasks shown in FIG. 9 in response to instructions 904 conveyed to processor 710 by medium 702 to perform actions associated with manufacturing a multilayer circuit board with optical vias as described herein. Some of those instructions may include creating optical via regions, creating p-n junctions over the optical vias, and/or creating electrical connections to the p-n junctions (e.g. diodes).

In some implementations, signal bearing medium 902 depicted in FIG. 9 may encompass a computer-readable medium 906, such as, but not limited to, a hard disk drive, a Compact Disc (CD), a Digital Video Disk (DVD), a digital tape, memory, etc. In some implementations, signal bearing medium 902 may encompass a recordable medium 908, such as, but not limited to, memory, read/write (R/W) CDs, R/W DVDs, etc. In some implementations, signal bearing medium 902 may encompass a communications medium 910, such as, but not limited to, a digital and/or an analog communication medium (e.g., a fiber optic cable, a waveguide, a wired communications link, a wireless communication link, etc.). Thus, for example, program product 900 may be conveyed to one or more modules of the processor 710 by an RF signal bearing medium 902, where the signal bearing medium 902 is conveyed by a wireless communications medium 910 (e.g., a wireless communications medium conforming with the IEEE 802.11 standard).

The present disclosure presents a multilayer circuit board with optical vias for data transmission between two or more layers according to some embodiments. The circuit board may include a circuit board 300 with two or more conductive layers 202 separated by a dielectric layer 204, an optical via 214 for providing an optical transmission path between the two or more layers of the circuit board 300, a photo-emitter component 216 coupled to one end of the optical via 214 and converting incident electrical signals to optical signals, and a photo-detector component 224 coupled to another end of the optical via 214 and converting the optical signals to received electrical signals.

The photo-emitter component 216 may be either a light emitting diode (LED) or a laser diode. The photo-emitter component 216 may include a p-n junction formed in a transparent conducting oxide layer 452 deposited on a top layer of the circuit board 300. The transparent conducting oxide layer 452 may include $SnO_2$, ZnO, or ITO. Furthermore, the photo-detector component 224 may include one or more of a p-n junction photodiode, a p-i-n photodiode, an avalanche photodiode, and/or a metal-semiconductor-metal (MSM) photo-detector.

The multilayer circuit board may further include an electrical component 220 electrically coupled to the photo-emitter component 216 and another electrical component 226 electrically coupled to the photo-detector component 224. The optical via 214 may correspond to one member of an array of optical vias associated with the multilayer circuit board. Moreover, the circuit board may include a number of conductive layers, where at least one of the optical vias may provide data transmission between a top conductive layer and an inner conductive layer.

The present disclosure also describes a method for manufacturing a multilayer circuit board with optical vias for data transmission between two or more layers of the multilayer circuit board. According to some embodiments, the method may include creating one or more regions of the multilayer circuit board (822) for optical vias, depositing a transparent conducting oxide (TCO) layer on a top layer of the multilayer circuit board (824), creating p-n junctions about the regions for the optical vias (828), and creating electrical connections to the p-n junctions acting as light emitting diodes (LEDs) (834).

According to further embodiments, the method may include depositing a transparent conducting oxide (TCO) layer 452 on a bottom layer of the multilayer circuit board, creating p-n junctions about the one or more regions for the optical vias (828), and creating electrical couplings to the p-n junctions acting as photodiodes (834). Creating the p-n junctions may include implanting the TCO layer with n-type impurities (826) and patterning the TOO layer to form the LEDs about the regions for the optical vias (828).

According to yet other embodiments, creating the electrical connections to the p-n junctions may include depositing a dielectric layer over the patterned TCO layer (830) while leaving one or more regions for vias over the p-n junctions, planarizing the dielectric layer (832), and filling the vias with a metallic material to provide electrical connections to the LEDs (834). Electrical components may be placed on one or more of the top and/or bottom layers of the multilayer circuit board (836), and a p-n junction 336 may be formed in an inner layer of the multilayer circuit board, where an optical via 340 is used to couple a top layer of the multilayer circuit board 300 and the inner layer of the multilayer circuit board 300.

The present disclosure further describes an apparatus for controlling manufacturing of a multilayer circuit board 300 with optical vias 214 for data transmission between two or more layers of the multilayer circuit board 300. According to some examples, the apparatus may include a memory with instructions stored thereon and a processor coupled to the memory and for executing the instructions. When executed, the instructions may cause the apparatus to create one or more regions for optical vias in the multilayer circuit board for data transmission between electrical components located on top and bottom layers of the multilayer circuit board (822), deposit a transparent conducting oxide (TCO) layer on the top and bottom layers of the multilayer circuit board (824), create p-n junctions about the regions for the optical via locations at the top and bottom layers (828) by implanting the TCO layer with n-type impurities (826), and create electrical couplings to the p-n junctions, where the p-n junctions are effective to act as either light emitting diodes (LEDs) or photodiodes (834).

According to further examples, to create the electrical connections to the p-n junctions, the apparatus may deposit a dielectric layer over the patterned TCO layer (830), planarize the dielectric layer (832), create one or more regions for vias over the p-n junctions, and fill the vias with a metallic material 574 to provide electrical connections to the LEDs (834). The apparatus may also place electrical components on the top and bottom layers of the multilayer circuit board (836) and couple at least some of the electrical components to the p-n junctions acting as LEDs and photodiodes.

The dielectric layer 572 may be from tetraethyl orthosilicate (TEOS), and the metallic material 574 from tungsten. The vias and the optical vias may be formed in the respective regions for the vias and optical vias by one or more of etching and/or drilling.

There is little distinction left between hardware and software implementations of aspects of systems; the use of hardware or software is generally (but not always, in that in certain contexts the choice between hardware and software may become significant) a design choice representing cost vs. efficiency tradeoffs. There are various vehicles by which processes and/or systems and/or other technologies described herein may be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, may be equivalently implemented in integrated circuits, as one or more computer programs running on one or more computers (e.g., as one or more programs running on one or more computer systems), as one or more programs running on one or more processors (e.g. as one or more programs running on one or more microprocessors), as firmware, or as virtually any combination thereof, and that designing the circuitry and/or writing the code for the software and/or firmware would be well within the skill of one of skill in the art in light of this disclosure.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, materials, and configurations, which can, of course, vary. It is also to be understood that the terminology used herein is for the purpose of describing particular embodiments only, and is not intended to be limiting.

In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control modules (e.g., adjusting manufacturing parameters of various phases of multilayer circuit board production).

A typical data processing system may be implemented utilizing any suitable commercially available components, such as those typically found in data computing/communication and/or network computing/communication systems. The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediate components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably couplable include but are not limited to physically connectable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A multilayer circuit board configured to support optical communication between layers of the multilayer circuit board, the multilayer circuit board comprising:
   a first layer that includes a first surface;
   a second layer that includes a second surface and that is distanced from the first layer by a dielectric layer;
   an optical via that runs between the first surface of the first layer and the second surface of the second layer, the optical via including a first end at the first surface of the first layer and a second end at the second surface of the second layer;
   a first transparent conductive oxide (TCO) layer formed on the first surface of the first layer and implanted with impurities so as to form a photo-emitter component at the first end of the optical via; and
   a second TCO layer formed on the second surface of the second layer and implanted with impurities so as to form a photo-detector component at the second end of the optical via.

2. The multilayer circuit board of claim 1, wherein the photo-emitter component formed by the first TCO layer implanted with impurities is located over the first end of the optical via, and wherein the photo-detector component formed by the second TCO layer implanted with impurities is located over the second end of the optical via.

3. The multilayer circuit board of claim 1, wherein the impurities implanted into the first and second TCO layers include n-type impurities that enable formation of a p-n junction.

4. The multilayer circuit board of claim 1, wherein the optical via is filled with a glass material.

5. The multilayer circuit board of claim 1, wherein the first layer comprises a top layer and the second layer comprises a bottom layer.

6. The multilayer circuit board of claim 1, further comprising a third layer distanced from the second layer by another dielectric layer, wherein the first layer comprises a top layer, the third layer comprises a bottom layer, and the second layer is located between the top and bottom layers.

7. A multilayer circuit board configured to support optical communication between layers of the multilayer circuit board, the multilayer circuit board comprising:
  a first layer that includes a first surface;
  a second layer that includes a second surface and that is distanced from the first layer by a first dielectric layer;
  a third layer that includes a third surface and that is distanced from the second layer by a second dielectric layer;
  a first optical via that is limited to run between the first surface of the first layer and the second surface of the second layer, the first optical via including a first end at the first surface of the first layer and a second end at the second surface of the second layer;
  a second optical via that runs between the first surface of the first layer and the third surface of the third layer, the second optical via including a first end at the first surface of the first layer and a second end at the third surface of the third layer;
  a first transparent conductive oxide (TCO) layer formed on the first surface of the first layer and implanted with impurities so as to form a first photo-emitter component at the first end of the first optical via, and further implanted with impurities so as to form a second photo-emitter component at the first end of the second optical via;
  a second TCO layer formed on the second surface of the second layer and implanted with impurities so as to form a first photo-detector component at the second end of the first optical via; and
  a third TCO layer formed on the third surface of the third layer and implanted with impurities so as to form a second photo-detector component at the second end of the second optical via.

8. The multilayer circuit board of claim 7, further comprising one or more electronic components coupled to one or more traces on the first surface of the first layer, the second surface of the second layer, and/or the third surface of the third layer.

9. The multilayer circuit board of claim 8, wherein the one or more electronic components are configured to control incident electrical signals provided to the first and second photo-emitter components through the one or more traces and received electrical signals from the first and second photo-detector components.

10. The multilayer circuit board of claim 9, wherein the first and second photo-emitter components are configured to convert the incident electrical signals to optical signals and the first and second photo-detector components are configured to convert the optical signals to the received electrical signals.

11. The multilayer circuit board of claim 7, wherein the first and second photo-emitter components comprise one of a light emitting diode (LED) and a laser diode.

12. The multilayer circuit board of claim 7, wherein the first and second photo-detector components comprise one of a p-n junction photodiode, a p-i-n photodiode, an avalanche photodiode, and a metal-semiconductor-metal (MSM) photodetector.

13. The multilayer circuit board of claim 7, wherein the first and second dielectric layers are comprised of polytetrafluoroethylene (Teflon), phenolic cotton paper (FR-2), cotton paper and epoxy (FR-3), or woven glass and epoxy (FR-4).

14. The multilayer circuit board of claim 7, wherein the first and second TCO layers are comprised of tin (IV) oxide ($SnO_2$), zinc oxide (ZnO), or indium tin oxide (ITO).

15. A method to manufacture a multilayer circuit board configured to support optical communication between layers of the multilayer circuit board, the method comprising:
  forming a first layer that includes a first surface;
  forming a second layer that includes a second surface and that is distanced from the first layer by a dielectric layer;
  forming an optical via that runs between the first surface of the first layer and the second surface of the second layer, the optical via including a first end at the first surface of the first layer and a second end at the second surface of the second layer;
  placing a first transparent conductive oxide (TCO) layer on the first surface of the first layer, and implanting the first TCO layer with impurities so as to form a photo-emitter component at the first end of the optical via; and
  placing a second TCO layer on the second surface of the second layer, and implanting the second TCO layer with impurities so as to form a photo-detector component at the second end of the optical via.

16. The method of claim 15, wherein implanting the first TCO layer and the second TCO layer with impurities comprises:
  forming p-n junctions on the first surface of the first layer and on the second surface of the second layer; and
  isolating the p-n junctions to form the photo-emitter component at the first end of the optical via and the photo-detector component at the second end of the optical via.

17. The method of claim 15, further comprising:
  creating electrical connections to one or more of the photo-emitter component and the photo-detector component.

18. The method of claim 17, wherein creating the electrical connections comprises:
  depositing another dielectric layer on one or more of the first and second TCO layers while leaving one or more regions for electrical vias over the one or more of the photo-emitter component and the photo-detector component, wherein the another dielectric layer comprises tetraethyl orthosilicate (TEOS);
  planarizing the another dielectric layer;
  forming the electrical vias in the one or more regions by one of drilling and etching; and
  filling the electrical vias with a metallic material to provide the electrical connections to the one or more of the photo-emitter component and the photo-detector component.

19. The method of claim 15, further comprising:
  placing one or more electronic components on one or more of the first surface of the first layer and the second surface of the second layer.

20. The method of claim 19, wherein placing the one or more electronic components comprises:

coupling the one or more electronic components to traces on the one or more of the first surface of the first layer and the second surface of the second layer using one of an epoxy, a metal alloy, and a metal.

21. The method of claim 15, wherein forming the optical via that runs between the first surface of the first layer and the second surface of the second layer comprises:

forming the optical via by one or more of etching and drilling.

* * * * *

UNITED STATES PATENT AND TRADEMARK OFFICE
CERTIFICATE OF CORRECTION

PATENT NO. : 8,933,390 B2  
APPLICATION NO. : 14/169145  
DATED : January 13, 2015  
INVENTOR(S) : Sievers et al.

It is certified that error appears in the above-identified patent and that said Letters Patent is hereby corrected as shown below:

Title page, Item (63), under "Related U.S. Application Data", Line 2, after "8,680,458" and before the "." that follows thereafter, insert --, which is a 371 application of PCT/US10/051788, filed Oct. 7, 2010 --, therefor.

On Page 2, Item (56), under "OTHER PUBLICATIONS", in Column 1, Lines 6-7, delete "Optial Communiation" Poceedings" and insert -- Optical Communication" Proceedings --, therefor.

On Page 2, Item (56), under "OTHER PUBLICATIONS", in Column 2, Line 12, delete "Univerisity," and insert -- University, --, therefor.

Specification

In Column 1, Lines 7-12, delete "This application is a continuation of co-pending U.S. patent application Ser. No. 13/002,043 filed on Dec. 29, 2010, which is the national phase filing of the PCT Application No. PCT/US10/051788 filed on Oct. 7, 2010 by the same inventor, commonly assigned herewith. Therefore, both applications are herein incorporated by reference in their entireties." and insert -- This application is a continuation under 35 U.S.C. § 120 of co-pending U.S. patent application Ser. No. 13/002,043 filed on December 29, 2010, now Pat. No. 8,680,458, which is the National Stage filing under 35 U.S.C. § 371 of PCT Application No. PCT/US10/051788 filed on October 7, 2010 by the same inventor, commonly assigned herewith. The disclosures of the U.S. Patent Application and the PCT Application are hereby incorporated by reference in their entireties. --, therefor.

In Column 2, Line 22, delete "TOO" and insert -- TCO --, therefor.

In Column 3, Line 25, delete "TOO" and insert -- TCO --, therefor.

In Column 8, Line 53, delete "TOO" and insert -- TCO --, therefor.

Signed and Sealed this  
First Day of March, 2016

Michelle K. Lee  
*Director of the United States Patent and Trademark Office*

CERTIFICATE OF CORRECTION (continued)
U.S. Pat. No. 8,933,390 B2

Specification

In Column 8, Line 60, delete "TOO" and insert -- TCO --, therefor.

In Column 10, Line 58, delete "TOO" and insert -- TCO --, therefor.

In Column 11, Line 1, delete "junction 336" and insert -- junction --, therefor.